United States Patent [19]
Voss et al.

[11] Patent Number: 5,386,153
[45] Date of Patent: Jan. 31, 1995

[54] BUFFER WITH PSEUDO-GROUND HYSTERESIS

[75] Inventors: Peter H. Voss, Watsonville; Shahryar Aryani, Santa Clara, both of Calif.

[73] Assignee: Cypress Semiconductor Corporation, San Jose, Calif.

[21] Appl. No.: 126,065

[22] Filed: Sep. 23, 1993

[51] Int. Cl.⁶ .................................. H03K 17/16
[52] U.S. Cl. ........................ 326/34; 326/65; 327/206
[58] Field of Search ............ 307/443, 451, 475

[56] References Cited

U.S. PATENT DOCUMENTS

| | | | |
|---|---|---|---|
| 3,984,703 | 10/1976 | Jorgensen | 307/451 |
| 4,258,272 | 3/1981 | Huang | 307/475 |
| 4,687,954 | 8/1987 | Yasuda | 307/475 |
| 4,740,717 | 4/1988 | Fletcher | 307/451 |
| 4,786,830 | 11/1988 | Foss | 307/475 |
| 5,034,623 | 7/1991 | McAdams | 307/475 |

Primary Examiner—Edward P. Westin
Assistant Examiner—Andrew Sanders
Attorney, Agent, or Firm—Blakely, Sokoloff, Taylor & Zafman

[57] ABSTRACT

A buffer utilizing the pseudo-ground hysteresis of the present invention contains first and second stage switching elements and a resistive element. The pseudo-ground hysteresis is implemented via a ground path from the switching elements. The first stage switching element is configured to have a first DC voltage trip point, and the second stage switching element is configured to have a second DC voltage trip point. As an input voltage, transitioning from a first state to a second state, is applied to the first stage switching element, a first current ($I_1$), from the first stage switching element, and a second current ($I_2$), from the second stage switching element, is generated. When the input voltage equals the first stage DC voltage trip point, the first and second stage switching elements transition. During the transition of the input voltage from the second state to the first state, the total current flowing through resistive element is reduced, and the voltage at the resistive element decreases. Consequently, the first stage switching element transitions at a voltage level offset from the first DC voltage trip point to provide hysteresis for the second state to first state transition of the input voltage.

15 Claims, 6 Drawing Sheets

BUFFER WITH PSEUDO-GROUND HYSTERESIS

BACKGROUND OF THE INVENTION

1. Field of the Invention

The present invention relates to hysteresis in a digital circuit, and more specifically to a buffer with pseudo-ground hysteresis.

2. Art Background

In designing digital circuits and systems, noise immunity and stability, are important criteria. For example, an input digital signal to a digital switching circuit that contains noise may cause the digital switching circuit to transition to a different state due to the noise and not due to the informational content of the signal. To prevent multiple triggering of the digital circuit and to provide noise immunity, digital switching circuits often employ hysteresis. In general, a circuit utilizing electrical hysteresis generates an output based on both an input and on the recent history of the circuit. In a digital circuit employing hysteresis, once a first state transition occurs, the circuit requires a different signal trip point to cause a transition to a second state. The difference in the input signal required to generate the second state transition in the circuit is defined as the amount of hysteresis. A particular amount of hysteresis for a digital circuit is dependent upon the particular application. A typical design value for hysteresis is 150 mV, where the input transition point for switching from a first state to a second state is 150 mV less than for the input transition point for switching from the second state to first state.

A common application for employing hysteresis in digital circuits is TTL input stages utilizing CMOS input buffers. A first technique for employing hysteresis in a CMOS buffer is shown in FIG. 1a. The circuit contains a CMOS inverter having a p-channel MOSFET transistor 10, and a n-channel MOSFET transistor 30 as a first input stage. A p-channel MOSFET transistor 20 is coupled to the p-channel transistor 10. A second stage CMOS inverter 25 is implemented to enable the gate of the p-channel device—specifically the output of the second stage is fed back to the gate of device 20. In this configuration, hysteresis is provided when the second stage transitions thereby enabling the p-channel MOSFET 20 to change the voltage trip point of the first stage inverter. A second technique for implementing hysteresis in a CMOS buffer is use of a Schmitt trigger as shown in FIG. 1b. In addition to the CMOS buffer, comprising of n-channel and p-channel MOSFET transistors 40 and 50, and a current buffer 75, the Schmitt trigger configuration uses additional n-channel and p-channel MOSFET transistors 60 and 70 to lower the voltage trip point when the input transitions from a high logic level to a low logic level. However, neither technique provides noise immunity through electrical isolation from the ground plane. The present invention is a CMOS buffer utilizing a pseudo-ground hysteresis.

SUMMARY AND OBJECTS OF THE INVENTION

Therefore, it is an object of the present invention to provide reliable hysteresis for an input buffer.

It is a further object of the present invention to provide hysteresis in an input buffer exhibiting noise immunity through electrical isolation from the ground plane.

These and other objects of the present invention are realized in an arrangement which includes a dual stage buffer utilizing pseudo-ground hysteresis. In a preferred embodiment of the present invention, the buffer comprises a CMOS buffer containing first and second stage CMOS inverters and a resistive element. In general, the pseudo-ground hysteresis configuration of the present invention implements hysteresis via a ground path from the CMOS inverters. To implement the pseudo-ground hysteresis of the present invention, the source of both n-channel MOSFETs in each CMOS inverter is connected to the resistive element, and the resistive element is connected to ground. The first stage CMOS inverter is configured to have a first direct current (DC) voltage trip point, and the second stage CMOS inverter is configured to have a second DC voltage trip point. If hysteresis is desired when an input voltage transitions from a high logic state to a low logic state after transitioning from a low logic state to a high logic state, then the CMOS inverters are configured such that the second input voltage trip point is greater than the first input voltage trip point.

In operation, an input voltage is applied to the input to the first stage CMOS inverter. As the input voltage rises from 0 volts to the first stage DC voltage trip point, the first stage CMOS inverter conducts a first current ($I_1$), and the second stage CMOS inverter conducts a second current ($I_2$) to the resistive element. The current $I_1$, flowing from the first stage CMOS inverter, and the current $I_2$, flowing from the second stage CMOS inverter, generates a voltage at the resistive element. When the input voltage increases to the first stage DC voltage trip point, the first stage CMOS inverter output voltage swiftly transitions from a high logic level to a low logic level. The transition of the first stage output voltage causes the second stage CMOS inverter to transition from a low logic Level to a high logic level.

After the input voltage transitions from a low logic level to a high logic level, the second stage CMOS inverter does not conduct $I_2$ current. Consequently, during this period, the total current flowing through resistive element is reduced, and the voltage at the resistive element decreases. When the input voltage decreases from a high logic level, the first stage CMOS inverter does not transition at the original DC voltage trip point due to the reduction in voltage at the resistive element. Instead, the first stage CMOS inverter transitions at a voltage level below the first DC voltage trip point to provide hysteresis for the high to low logic level transition of the input voltage. The present invention also provides noise immunity from the ground plane such that a noise bounce in the ground plane does not result in an unnecessary transitional glitch on the output of the CMOS buffer.

BRIEF DESCRIPTION OF THE DRAWINGS

The objects, features, and advantages of the present invention will be apparent from the following detailed description of the preferred embodiment of the invention with references to the following drawings.

FIG. 4a illustrates a voltage waveform input to the first stage CMOS inverter; FIG. 4b illustrates an output voltage waveform from the first stage CMOS inverter; and FIG. 4c illustrates an output voltage waveform of the second stage CMOS inverter.

DETAILED DESCRIPTION

A buffer with pseudo-ground hysteresis is disclosed. In the following description, for purposes of explanation, specific nomenclature is set forth to provide a thorough understanding of the present invention. However, it will be apparent to one skilled in the art that these specific details are not required to practice the present invention. In other instances, well known circuits and devices are shown in block diagram form to avoid obscuring the present invention unnecessarily.

Figure 1A:
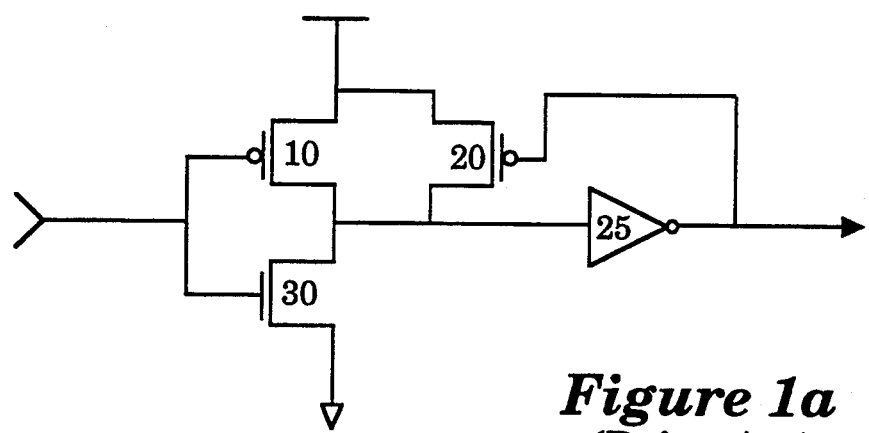
FIG. 1a illustrates a conventional hysteresis configuration.
Figure 1B:
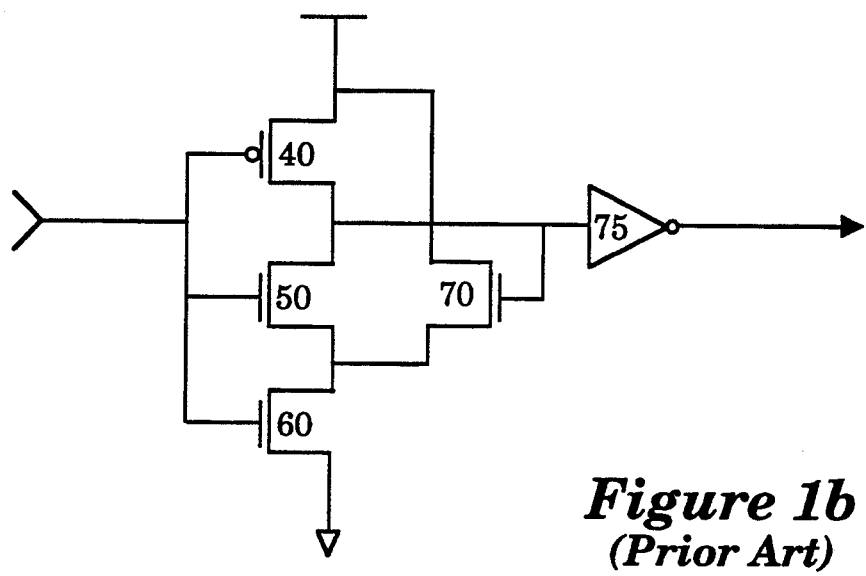
FIG. 1b illustrates a prior art Schmitt Trigger device.
Figure 1C:
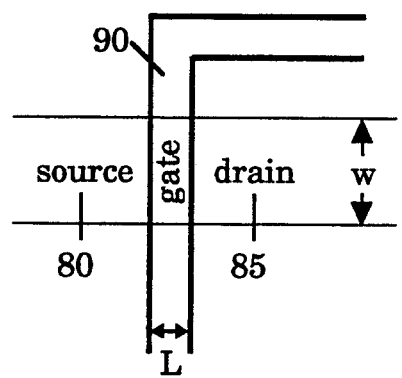
FIG. 1c illustrates a perspective view above an MOS field effect transistor having a gate 90, a source 80, and a drain 85. This figure is used to show the definition as used herein of the aspect ratio of a field effect transistor, which is the width, as shown in FIG. 1c divided by the length, as shown in FIG. 1c.
Figure 2:
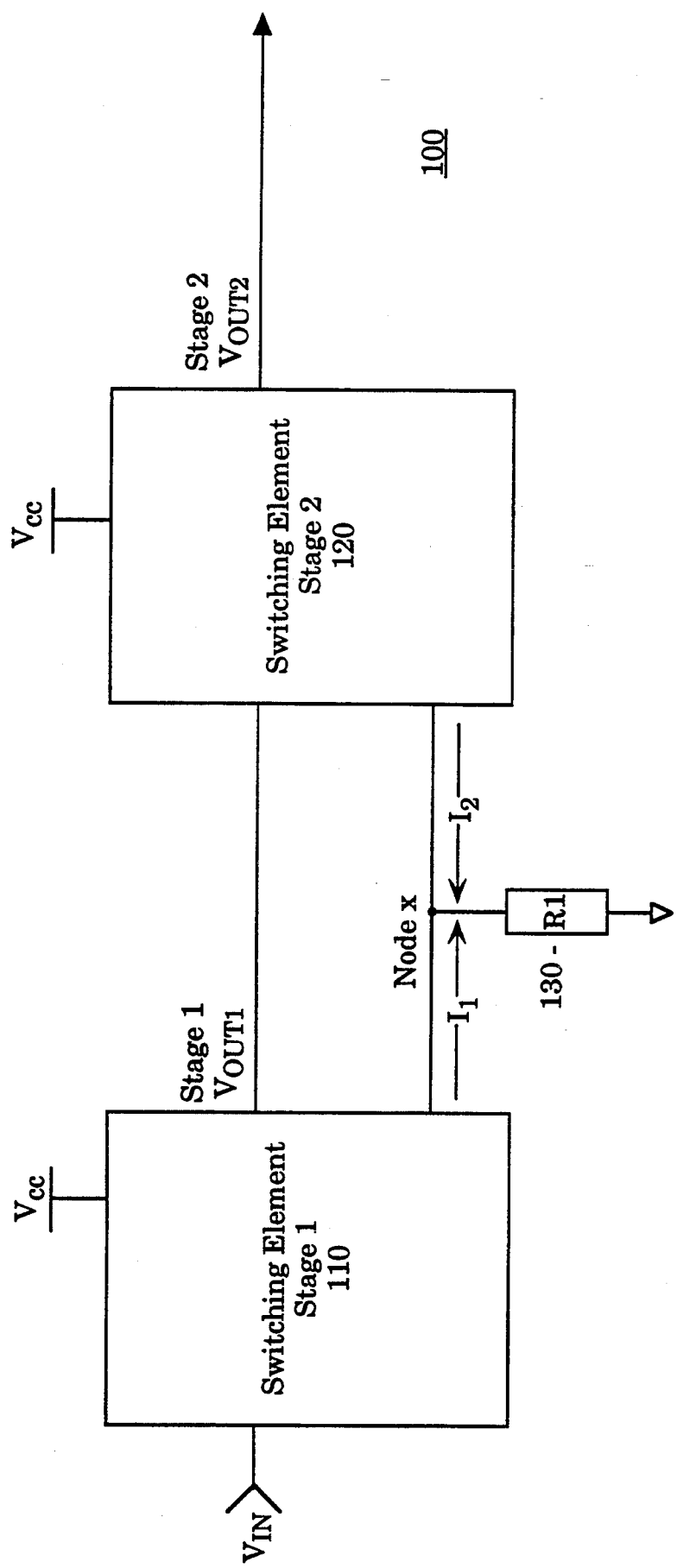
FIG. 2 illustrates a high level block diagram of a buffer containing pseudo-ground hysteresis configured in accordance with the present invention.

Referring to FIG. 2, a high Level block diagram of a buffer containing pseudo-ground hysteresis configured in accordance with the present invention is illustrated. A buffer 100 utilizing the pseudo-ground hysteresis of the present invention contains dual stage switching elements 110 and 120. In addition, the buffer 100 contains a resistive element 130. The switching element 110 is the first stage and the switching element 120 is the second stage of the dual stage buffer 100 such that the output of switching element 110 is coupled to the input of switching element 120. To implement the pseudo-ground hysteresis of the present invention, the ground paths of both switching elements 110 and 120 are connected to the resistive element 130, and the resistive element 130 is connected to ground. The switching elements 110 and 120 may comprise any digital switching circuit such as a NAND gate or an inverter. A preferred embodiment for switching elements 110 and 120 is described more fully below. The resistive element 130 typically operates as a voltage generation means and is coupled to a ground path of the first and second stage switching elements. The resistive element 130 may constructed as a enhancement type metal oxide semiconductor field effect transistor (MOSFET), or any other resistive load. A preferred embodiment for the resistive element 130 is described fully below.

In general, the pseudo-ground hysteresis configuration of the present invention implements hysteresis via a ground path from switching elements 110 and 120. The switching element 110 is configured to have a first direct current (DC) voltage trip point, and the switching element 120 is configured to have a second DC trip point. If hysteresis is desired when an input voltage transitions from a high logic state to a low logic state after transitioning from a low logic state to a high logic state, then the switching elements 110 and 120 are configured such that the second input voltage trip point is greater than the first input voltage trip point. For example, the switching element 110 may contain a DC voltage trip point of 1.5 volts, and the switching element 120 may contain a DC voltage trip point of 2.5 volts. Alternatively, if hysteresis is desired when an input voltage transitions from a low logic state to a high logic state after transitioning from a high logic state to a low logic state, then the switching elements 110 and 120 are configured such that the first input voltage trip point is greater than the second input voltage trip point.

In a preferred embodiment of the present invention, switching elements 110 and 120 comprise complementary metal oxide semiconductor (CMOS) inverters. The operation of the present invention is described in conjunction with a CMOS buffer having hysteresis when the input voltage transitions from a high logic state to a low logic state after transitioning from a low logic state to a high logic state. However, operation of a CMOS buffer having hysteresis configured in accordance with the present invention when the input voltage transitions from a low logic state to a high logic state after transitioning from a high logic state to a low logic state involves reversing the levels of the DC trip points in the first and second CMOS inverters. In operation, an input voltage is applied to the input of CMOS inverter 110. Initially, the input voltage is in a low level state of approximately 0 volts. Therefore, the first stage CMOS inverter outputs a high level voltage, and the second stage CMOS inverter outputs a low level voltage. As the input voltage rises from 0 volts to the first stage DC voltage trip point, the CMOS inverter 110 conducts a current ($I_1$) and the CMOS inverter 120 conducts a current ($I_2$) to the resistive element 130. The generation of current $I_1$ from the first stage CMOS inverter 110 and current $I_2$ from the second stage CMOS inverter 120 causes a rise in the voltage at Node X shown on FIG. 2.

When the input voltage increases to the first stage DC voltage trip point, the first stage output voltage (Stage 1 $V_{OUT1}$) swiftly transitions from a high logic level to a low logic level. The transition of the Stage 1 $V_{OUT1}$ causes the second stage CMOS inverter 120 to transition from a low logic level to a high logic level. Upon transitioning from a low logic level to a high logic level, the second stage CMOS inverter 120 does not conduct $I_2$ current. Therefore, subsequent to transitioning of the second stage CMOS inverter 120, only the first stage CMOS buffer 110 generates current ($I_1$). Consequently, during this period, the total current flowing through resistive element 130 is reduced, and the voltage at Node X decreases. When the input voltage decreases from a high logic level, the first stage CMOS inverter 110 does not transition at the original DC voltage trip point due to the reduction in voltage at Node X. Instead, the first stage CMOS inverter 110 transitions at a voltage level below the first DC voltage trip point to provide hysteresis for the high to low logic level transition of the input voltage.

Note, the low to high logic level transition of the input voltage raises the voltage on Node X, while the high to low logic level transition of the input voltage does not because the first stage CMOS inverter 110 already generated the $I_1$ current from the DC voltage trip point prior to the additional current being supplied from the second stage CMOS inverter 120. The additional current $I_2$ generated by the second stage CMOS inverter 120 dictates the amount of hysteresis applied to the first stage CMOS inverter 110 for the high to low logic level transition DC voltage trip point. Also note that the internal Node X, generating the pseudo-ground hysteresis, is decoupled from the ground. Therefore, a noise bounce in the ground plane does not result in an unnecessary transitional glitch on the output of the CMOS buffer 100. The CMOS buffer with pseudo-ground hysteresis of the present invention may be utilized in all CMOS circuits requiring hysteresis. For example, in the field of static random access memories (SRAMs), the present invention has application for use as a TTL address buffer to convert TTL input signals to CMOS compatible levels.

Figure 3:
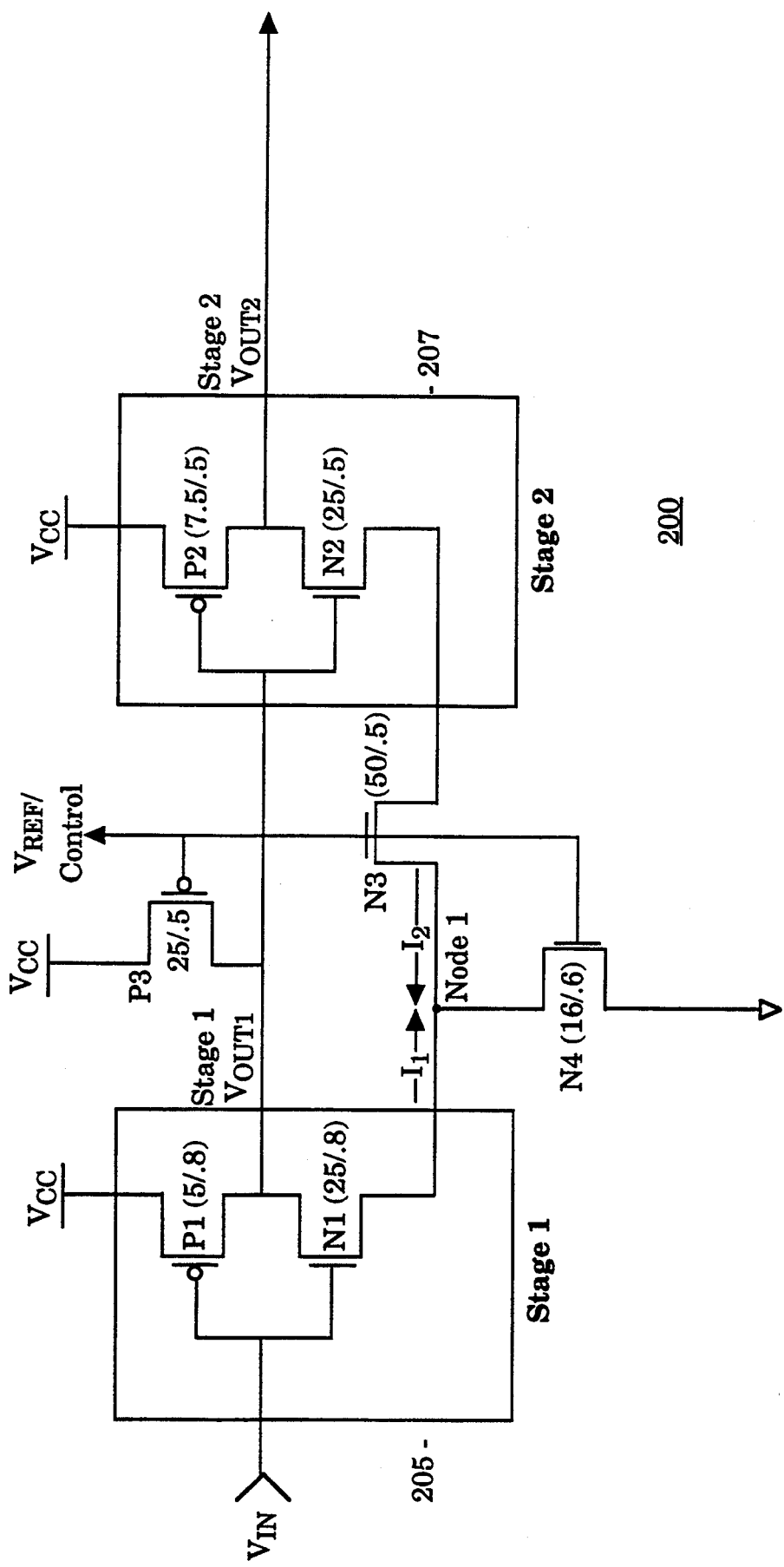
FIG. 3 illustrates a preferred embodiment of a CMOS buffer with pseudo-ground hysteresis configured in accordance with the present invention.

Referring to FIG. 3, a preferred embodiment of a CMOS buffer with pseudo-ground hysteresis configured in accordance with the present invention is illustrated. A CMOS buffer 200 contains a first stage CMOS inverter 205 and a second stage CMOS inverter 207. The CMOS inverter 205 contains a p-channel enhancement-type MOSFET (transistor P1), and a n-channel enhancement-type MOSFET (transistor N1). Similarly, the inverter 207 is constructed of a p-channel enhancement-type MOSFET (transistor P2) and a n-channel enhancement-type MOSFET (transistor N2). The CMOS buffer 200 also contains n-channel MOSFET transistor N4 as a resistive element for implementing the pseudo-ground hysteresis. To implement the resistive element, the source of transistor N1 is coupled to the drain of transistor N4 and the source of transistor N3. The source of transistor N4 is connected to ground, and the drain of transistor N3 is connected to the source of transistor N2.

In a preferred embodiment, a p-channel enhancement-type MOSFET (transistor P3) and a n-channel enhancement-type MOSFET (transistors N3) are added to reduce stand-by current when a plurality of CMOS buffers are implemented in an array. Specifically, the gates of transistors N3, N4, and P3 are coupled to a reference voltage ($V_{REF}$), such as the source voltage $V_{cc}$ or a control signal. When the control signal or $V_{REF}$ is a high logic level, the pseudo-ground hysteresis of the present invention is enabled or selected. Alternatively, when the control signal or $V_{REF}$ is a low logic level, the output of the first stage CMOS buffer 205 is pulled to a high logic state via transistor P3. Consequently, the control signal or $V_{REF}$ reduces the amount of current drawn from the CMOS inverters 205 and 207 when the respective CMOS buffer is not selected.

The size of transistors P2, N2 and N4 are selected based on a predetermined amount of hysteresis desired for a particular application. Typically, digital switching circuits are designed to provide approximately 150 mV of hysteresis. In a preferred embodiment of the present invention, transistor P2 is constructed to have a channel width/length, in microns, of 7.5/0.5, transistor N2 is constructed to have a channel width/length 25/0.5, and transistor N4 has a channel width/length of 16/0.6. In addition, transistor P1 is constructed to have a channel width/length ratio of 5/0.8; transistor N1 has a channel width/length of 25/0.8; transistor N3 has a width/length of 50/0.5; and transistor P3 has a width/length of 2.5/0.5. Also, for use as a TTL input buffer, the CMOS inverter 205 is configured to have a DC voltage trip point of 1.5 volts, and the CMOS inverter 207 is constructed to have a DC voltage trip point of 2.5 volts. The balancing of p-channel and n-channel MOSFET transistors in CMOS inverters to obtain a desired DC voltage trip point is well-known in the art and will not be described further.

For purposes of explanation, various nodes and currents are labeled on FIG. 3. The current flowing out of the source of transistor N1 on the CMOS inverter 205 is labeled $I_1$, and the current flowing out of the source of transistor N2 on the CMOS inverter 207 is labeled $I_2$. In addition, the voltage measured at the source of transistor N1 to ground is labeled Node 1 voltage. Furthermore, the output signal of the first stage CMOS inverter 205 is labeled Stage 1 $V_{OUT1}$. The Stage 1 $V_{OUT1}$ signal is input to the second stage CMOS inverter 207, and in turn the second stage CMOS inverter 207 generates an output signal labeled Stage 2 $V_{OUT2}$. In operation, a signal, $V_{IN}$, is input to the first stage CMOS inverter 205. For purposes of explanation, assume the $V_{IN}$ signal initially resides in a low logic level of approximately 0 volts. In the initial state, the first stage CMOS inverter 205 is biased such that transistor P1 operates in an active region, and the transistor N1 is cut-off so that no current is conducted. In the initial state, Stage 1 $V_{OUT1}$ retains a voltage of $V_{CC}$ or approximately 5 V, and consequently CMOS inverter 207 is biased such that transistor N2 operates in an active region, and transistor P2 is cut-off so that no current is conducted. Therefore, Stage 2 $V_{OUT2}$ retains a low logic level voltage of approximately 0 volts.

Figure 4A:
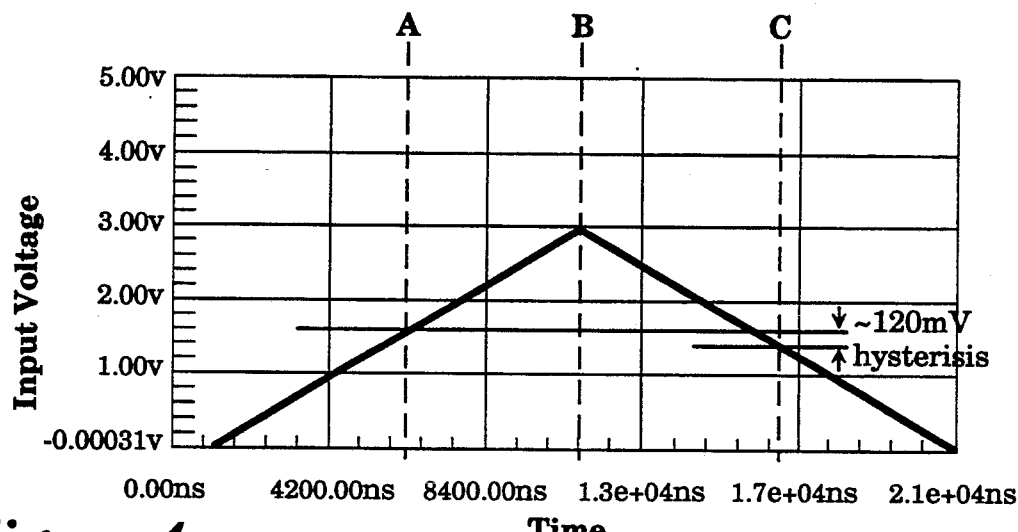
FIGS. 4a-4c illustrate voltage waveforms for the CMOS buffer configured in accordance with the present invention.
Figure 5:
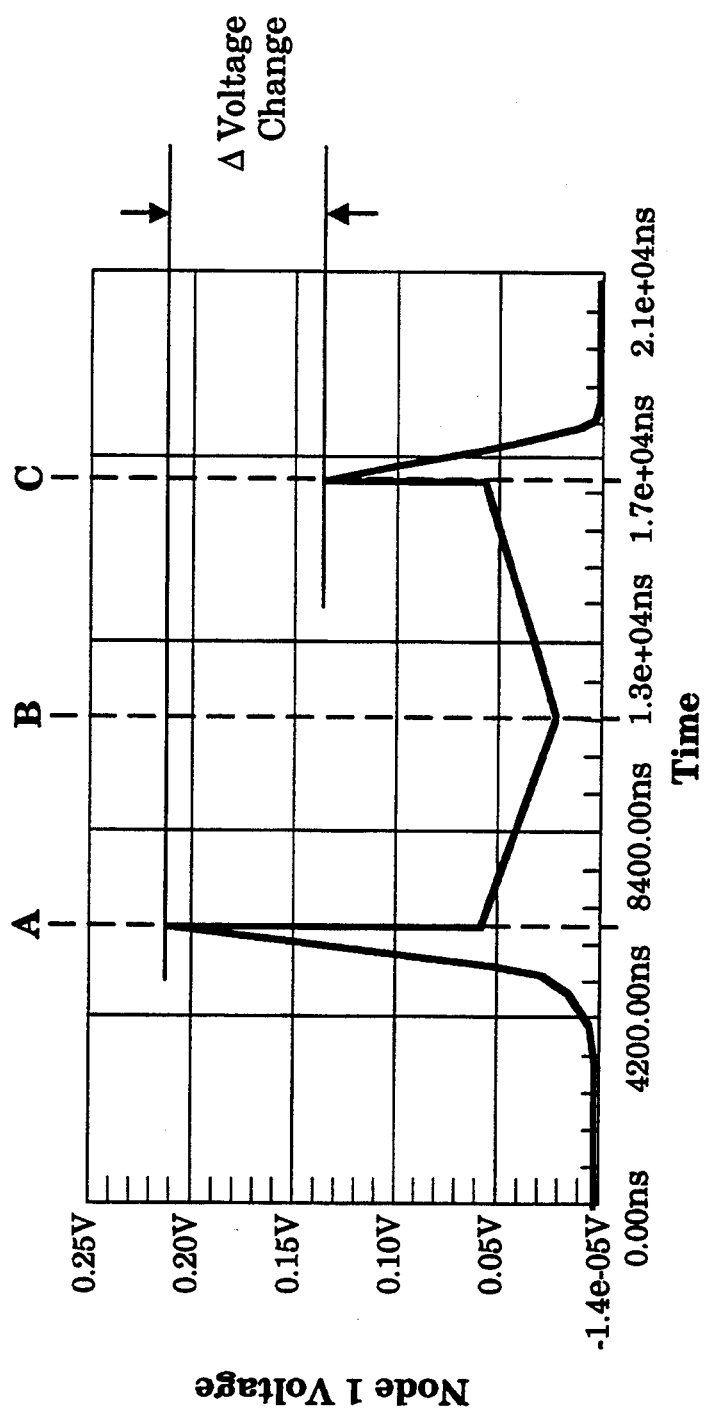
FIG. 5 illustrates the voltage waveform for the voltage at Node 1.
Figure 6A:
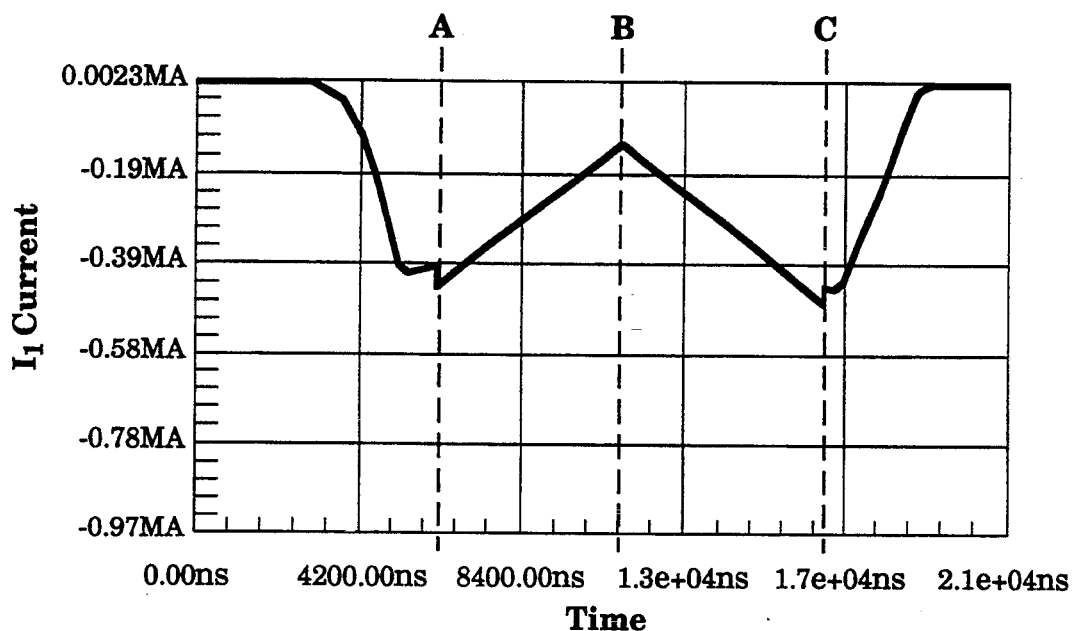
FIGS. 6a and 6b illustrate the current waveforms for the $I_1$ current from the first stage CMOS inverter, and the $I_2$ current from the second stage CMOS inverter, respectively.

Referring to FIG. 4a, an example voltage waveform input to the first stage CMOS inverter 205 is shown. For purposes of explanation, FIG. 4a shows a reference line A drawn at a time when the input voltage $V_{IN}$ attains the DC voltage trip point for CMOS inverter 205. As the input voltage $V_{IN}$ increases from 0 volts, no current is conducted from the source to transistor N1 until the input voltage $V_{IN}$ attains the threshold voltage of transistor N1. When the input voltage $V_{IN}$ exceeds the threshold voltage of transistor N1, the transistor N1 is biased in the pinch-off region of operation, and consequently begins to conduct current. As the input voltage $V_{IN}$ continues to rise toward the DC voltage trip point of CMOS inverter 205, additional $I_1$ current is conducted. Referring to FIG. 6a, a current waveform for the $I_1$ current in response to the input voltage waveform of FIG. 4a is shown. As shown in FIG. 6a, $I_1$ current increases as the input voltage surpasses the threshold voltage of transistor N1. In FIG. 5, a voltage waveform for the Node 1 voltage in response to the input voltage of FIG. 4a is illustrated. As the $I_1$ current increases, the Node 1 voltage rises.

Figure 4B:
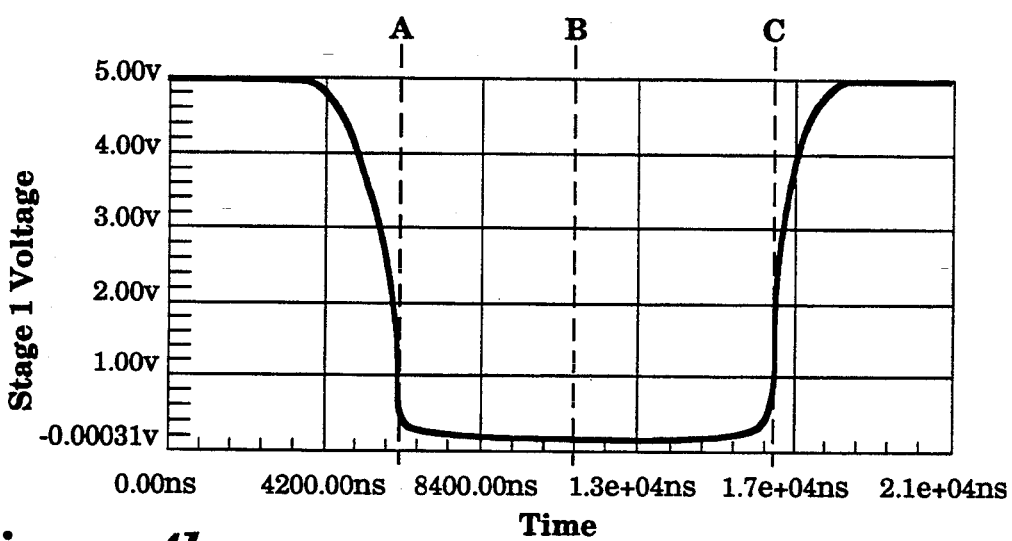
Figure 6B:
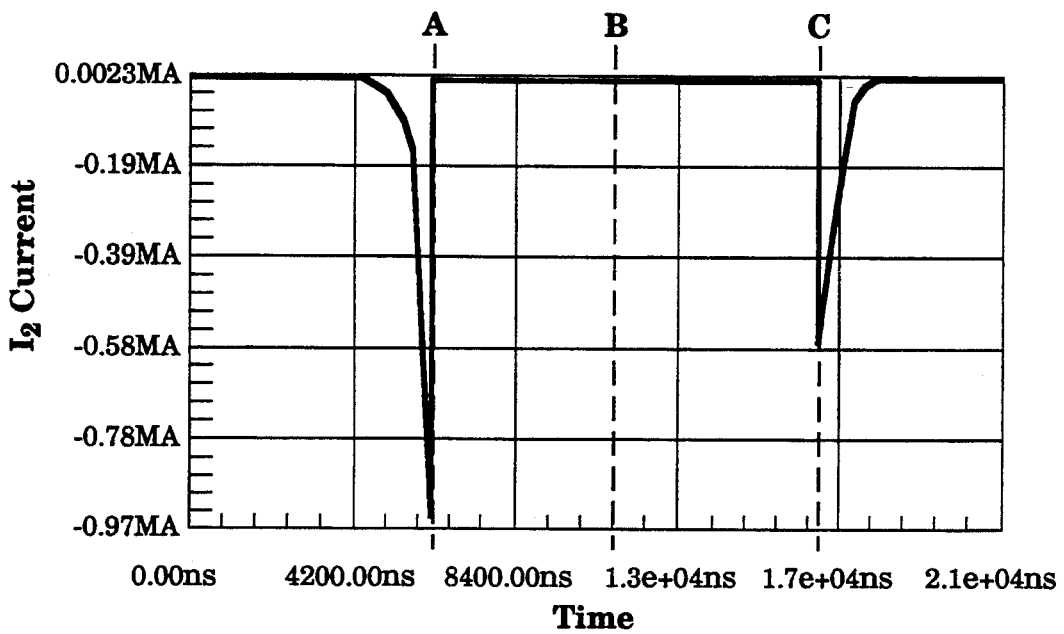

Referring to FIG. 4b, a voltage waveform for the Stage 1 $V_{OUT1}$ in response to the input voltage $V_{IN}$ of FIG. 4a is depicted. The voltage waveform of FIG. 4b shows the Stage 1 $V_{OUT1}$ output voltage decreasing subsequent to the $V_{IN}$ voltage attaining the N1 threshold voltage and prior to the $V_{IN}$ voltage attaining the DC voltage trip point of CMOS inverter 205. The decrease in Stage 1 $V_{OUT1}$ is due to the conducting of $I_1$ current in transistor N1. As the Stage 1 $V_{OUT1}$ voltage decreases from 5 volts, transistor P2 begins conducting current when the Stage 1 $V_{OUT1}$ voltage equals the threshold voltage of transistor P2. As transistor P2 begins to conduct current, the current $I_2$ increases as shown in FIG. 6b. Consequently, an increase in current $I_2$ from CMOS inverter 207 causes an increase in the voltage at Node 1 as shown in FIG. 5. Note that the $I_2$ current is greater than the $I_1$ current due to the size differential between transistors P2, N2 and transistors P1 and N1.

When the input voltage $V_{IN}$ reaches the DC voltage trip point of CMOS inverter 205, the Stage 1 $V_{OUT1}$ transitions from a high logic level to a low logic level. As discussed above, in the preferred embodiment, the first stage CMOS inverter 205 is constructed to have a DC voltage trip point of 1.5 volts, and the second stage CMOS inverter 207 is constructed to have a DC voltage trip point of 2.5 volts. Therefore, when input voltage $V_{IN}$ increases to 1.5 volts, transistors N1 and P1 are biased in the pinch-off region of operation and consequently conduct maximum $I_1$ current. As the $I_1$ current increases to a maximum value at the DC voltage trip point, the Node 1 voltage also attains a maximum voltage level as shown in FIG. 5 at the reference line A. Consequently, the Stage 1 $V_{OUT1}$ voltage decreases due to the depletion of current through transistor N1 as shown in the voltage waveform of FIG. 4b at the reference line A. A rapid decrease in the Stage 1 $V_{OUT1}$ voltage level provides an input to the second stage CMOS inverter 207 decreasing below the DC voltage trip point level for CMOS inverter 207. Specifically, when the Stage 1 $V_{OUT1}$ voltage drops below 2.5 volts, the transistor N2 is biased to turn off. When transistor N2 turns off, the $I_2$ current swiftly decreases as shown in FIG. 6b, and the Node 1 voltage decreases as shown in FIG. 5. Also, cutting off transistor N2 results in the Stage 2 $V_{OUT2}$ output voltage rising to the $V_{CC}$ level of approximately 5 volts.

For the example input voltage $V_{IN}$ waveform shown in FIG. 4a, the input voltage $V_{IN}$ continues to increase to a maximum of 3 volts at a time indicated by a reference line B. During the period indicated between reference lines A and B, transistor P1 is biased to reduce current flow as the input voltage $V_{IN}$ continues to increase. Consequently, a decrease in current flow from transistor P1 results in a decrease of $I_1$ current in the period between reference lines A and B as shown in FIG. 6a. As $I_1$ current decreases, the voltage at Node 1 also decreases in the period between reference lines A and B as shown in FIG. 5. Because the $I_2$ current equals 0 during the period between reference lines A and B, the voltage at Node 1 is not increased due to $I_2$ current. During the period between reference lines A and B, the Stage 1 $V_{OUT1}$ output voltage remains at a low logic level, and the Stage 2 $V_{OUT2}$ output voltage remains at a high logic level.

Figure 4C:
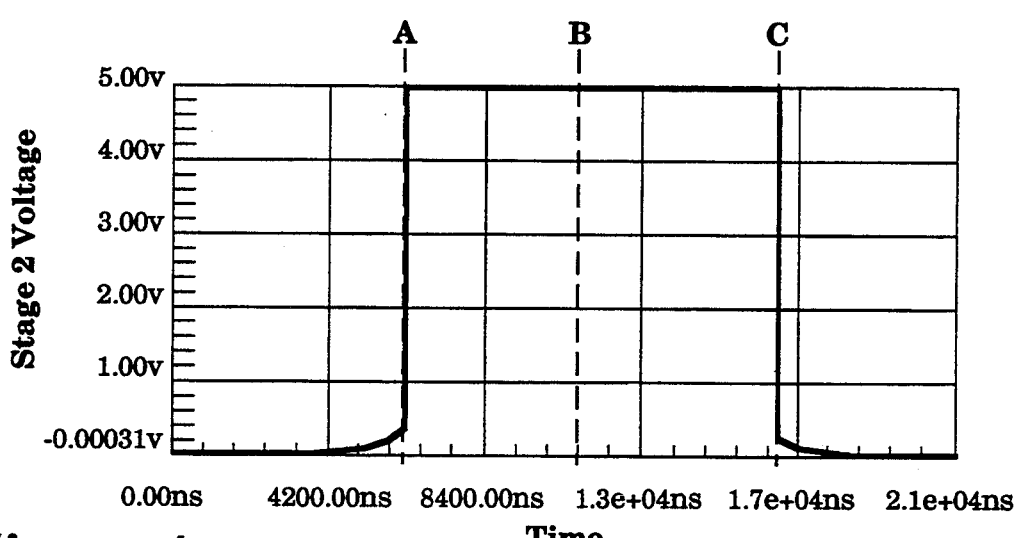

For purposes of explanation, a reference line C is drawn at the time period for the 1 to 0 transition DC voltage trip point on the first stage CMOS inverter 205. As the input voltage $V_{IN}$ decreases from 3 volts during a period between the reference lines B and C but prior to the 1 to 0 transition, the transistor P1 is biased to conduct more current. Consequently, as transistor P1 supplies more current to transistor N1, the $I_1$ current increases during the period between the reference lines B and C as shown in FIG. 6a. As $I_1$ current increases, the voltage at Node 1 also increases during the same period. Because transistor N1 continues to conduct all current supplied by transistor P1, the Stage 1 $V_{OUT1}$ remains at a low logic level as shown in FIG. 4b. The low logic level voltage of Stage 1 $V_{OUT1}$ continues to bias transistor N2 such that no current is conducted. Therefore, $I_2$ current remains at 0 during the period between the reference lines B and C as shown in FIG. 6b. The Stage 2 $V_{OUT2}$ output voltage remains at a high logic level as shown in FIG. 4c.

Referring to FIG. 4a, note that the 1 to 0 transition DC voltage trip point at the reference line C is approximately 120 mV below the 0 to 1 transition DC voltage trip point of 1.5 volts. Without the pseudo ground hysteresis of the present invention, CMOS inverter 205 would transition at 1.5 volts as the input voltage $V_{IN}$ decreases from the 1 to 0 logic level. However, the introduction of the pseudo ground hysteresis causes the DC trip point to be lowered. Referring to FIG. 5, note that the Node 1 voltage at the reference line A, occurring at the 0 to 1 DC voltage trip point, is greater than the Node 1 voltage at the reference line C occurring at the 1 to 0 DC voltage trip point. The difference in the Node 1 voltage between the 0 to 1 DC trip point and the 1 to 0 DC trip point is labeled as the A voltage change on FIG. 5. The Node 1 voltage is located at the source of transistor N1, and the input voltage Vin is coupled to the gate of transistor N1. Consequently, because the voltage on the source of transistor N1 (Node 1) is lower at reference line C than at reference lines A, a lower input voltage $V_{IN}$ is required at the gate of transistor N1 to cause the CMOS inverter 205 to transition. For the size of transistors P2, N2 and N4 specified in FIG. 3, approximately 120 mV of hysteresis is generated. In addition, various values of hysteresis can be generated by configuring the transistors to generate a desired $\Delta$ voltage change at Node 1.

The CMOS inverter 205 entering the 1 to 0 DC voltage trip point results in a rapid increase in the Stage 1 $V_{OUT1}$ output voltage as shown in a period after the reference line C in FIG. 4b. Consequently, an increase in Stage 1 output voltage causes the second stage CMOS inverter 207 to attain a 0 to 1 DC voltage trip point. During the 1 to 0 trip point transition, transistors P2 and N2 operate in the pinch-off region conducting maximum current as shown in FIG. 6b. As the Stage 1 $V_{OUT1}$ output voltage continues to rise, the current flowing through transistor P2 is reduced until the Stage 1 $V_{OUT1}$ output voltage attains the P1, P2 threshold voltage. The output of CMOS inverter 207 thus drops to a low logic voltage level as shown in FIG. 4c.

Although the present invention has been described in terms of a preferred embodiment, it will be appreciated that various modifications and alterations might be made by those skilled in the art without departing from the spirit and scope of the invention. The invention should therefore be measured in terms of the claims which follow.

What is claimed is:
1. A buffer with hysteresis comprising:
   a first stage switching element comprising a first DC voltage trip point;
   a second stage switching element comprising a second DC voltage trip point, said second stage switching element being coupled to said first stage switching element such that transition of said first stage switching element results in subsequent transition of said second switching element; and
   voltage generation means coupled to a ground path of said first and second stage switching elements for generating a voltage for hysteresis, said voltage generation means generating a first voltage at said ground path as an input voltage, applied to said first stage switching element, transitions from a first logic state to a second logic state, and generating a second voltage at said ground path when said input voltage transitions from said second logic state to said first logic state, wherein said first stage switching element transitions when said input voltage transitions from said first logic state to said first DC voltage trip point, and said first stage switching element transitions when said input voltage transitions from said second logic state to a voltage level being offset from said first DC voltage trip point in accordance with a difference between said second voltage and said first voltage.

2. The buffer with hysteresis as claimed in claim 1 wherein, said second DC trip point being greater than said first DC trip point, said second voltage being less than said first voltage, said first logic state being a low logic state and said second logic state being a high logic state such that said first stage switching element transitions when said input voltage increases from said low logic state to said first DC voltage trip point, and said first stage switching element transitions when said input voltage decreases from said high logic state to a voltage level below said first DC trip point in accordance with a difference between said second voltage and said first voltage.

3. The buffer with hysteresis as claimed in claim 1 wherein, said second DC trip point being less than said first DC trip point, said second voltage being greater than said first voltage, said first logic state being a high logic state and said second logic state being a low logic state such that said first stage switching element transitions when said input voltage decreases from said high logic state to said first DC voltage trip point, and said first stage switching element transitions when said input voltage increases from said low logic state to a voltage level above said first DC trip point in accordance with a difference between said second voltage and said first voltage.

4. The buffer with hysteresis as claimed in claim 1 wherein said voltage generation means comprises a first n-channel MOSFET coupled to said ground path of said first and second stage switching elements.

5. The buffer with hysteresis as claimed in claim 4 further comprising a p-channel enhancement type MOSFET and a second n-channel enhancement type MOSFET, said p-channel MOSFET being coupled to an output of said first stage switching element and said n-channel MOSFET being coupled between said voltage generation means and said second switching element, such that applying a low level voltage to the gates of said p-channel MOSFET and said first and second n-channel MOSFETs results reduction of stand-by current in said first and second switching elements.

6. The buffer with hysteresis as claimed in claim 5 wherein said buffer comprises a TTL address buffer.

7. A CMOS buffer with hysteresis comprising:
a first stage CMOS inverter comprising a first DC voltage trip point, said first stage CMOS inverter transitioning when an input voltage increases from a low logic level to said first DC voltage trip point;
a second stage CMOS inverter comprising a second DC voltage trip point, said second stage CMOS inverter being coupled to said first stage CMOS inverter such that transitioning of said first stage CMOS inverter results in subsequent transition of said second stage CMOS inverter; and
a resistive element coupled to a ground path of said first and second stage CMOS inverters, said resistive element receiving a first current from said first stage CMOS inverter and a second current from said second stage CMOS inverter so as to generate a first voltage at said ground path as said input voltage transitions from a first logic level to a second logic level, and said resistive element receiving said first current from said first stage CMOS buffer so as to generate a second voltage at said ground path, after transitioning of said second CMOS inverter, wherein said first stage CMOS inverter transitions, when said input voltage transitions from said second logic level to said first logic level, at a voltage level being offset from said first DC trip point, in accordance with a difference between said second voltage and said first voltage.

8. The CMOS buffer with hysteresis as claimed in claim 7 wherein, said second DC trip point being greater than said first DC trip point, said second voltage being less than said first voltage, said first logic state being a low logic state and said second logic state being a high logic state such that said first stage CMOS inverter transitions when said input voltage increases from said low logic state to said first DC voltage trip point, and said first stage CMOS inverter transitions when said input voltage decreases from said high logic state to a voltage level below said first DC trip point in accordance with a difference between said second voltage and said first voltage.

9. The CMOS buffer with hysteresis as claimed in claim 7 wherein, said second DC trip point being less than said first DC trip point, said second voltage being greater than said first voltage, said first logic state being a high logic state and said second logic state being a low logic state such that said first stage CMOS inverter transitions when said input voltage decreases from said high logic state to said first DC voltage trip point, and said first stage CMOS inverter transitions when said input voltage increases from said low logic state to a voltage level above said first DC trip point in accordance with a difference between said second voltage and said first voltage.

10. The CMOS buffer with hysteresis as claimed in claim 7 wherein said resistive element comprises a first n-channel MOSFET coupled to said ground path of said first and second stage CMOS inverters.

11. The CMOS buffer with hysteresis as claimed in claim 10 further comprising a p-channel enhancement type MOSFET and a second n-channel enhancement type MOSFET, said p-channel MOSFET being coupled to an output of said first stage CMOS buffer and said n-channel MOSFET being coupled between said voltage generation means and said second CMOS inverter, such that applying a low level voltage to the gates of said p-channel MOSFET and said first and second n-channel MOSFETs results in reduction of stand-by current in said first and second CMOS inverters.

12. The CMOS buffer with hysteresis as claimed in claim 11 wherein said CMOS buffer comprises a TTL address buffer, said TTL address buffer converting TTL input signals to CMOS compatible signals.

13. A method for generating hysteresis in a buffer comprising first and second stage switching elements, said method comprising the steps of:
configuring said first stage switching element with a first DC voltage trip point;
configuring said second stage switching element with a second DC voltage trip point;
generating a first voltage at a ground path to said first and second stage switching elements as an input voltage, applied to said first stage switching element, transitioning from a first logic level to said first DC voltage trip point;
transitioning said first stage switching element and subsequently, said second stage switching element when said input voltage equals said first DC voltage trip point;

generating a second voltage at said ground path after transition of said first and second switching elements; and transitioning said first stage switching element and said second stage switching element when said input voltage transitions from said second logic level to a voltage level being offset from said first DC trip point, in accordance with a difference between said second voltage and said first voltage.

14. The method for generating hysteresis in a buffer as claimed in claim 13 wherein, said second DC trip point being greater than said first DC trip point, said second voltage being less than said first voltage, said first logic state being a low logic state and said second logic state being a high logic state such that said first stage switching element transitions when said input voltage increases from said low logic state to said first DC voltage trip point, and said first stage switching element transitions when said input voltage decreases from said high logic state to a voltage level below said first DC trip point in accordance with a difference between said second voltage and said first voltage.

15. The method for generating hysteresis in a buffer as claimed in claim 13 wherein, said second DC trip point being less than said first DC trip point, said second voltage being greater than said first voltage, said first logic state being a high logic state and said second logic state being a low logic state such that said first stage switching element transitions when said input voltage decreases from said high logic state to said first DC voltage trip point, and said first stage switching element transitions when said input voltage increases from said low logic state to a voltage level above said first DC trip point in accordance with a difference between said second voltage and said first voltage.

* * * * *